(12) United States Patent
Miyata et al.

(10) Patent No.: US 7,540,946 B2
(45) Date of Patent: Jun. 2, 2009

(54) PLATING APPARATUS

(75) Inventors: Shingo Miyata, Tokyo (JP); Atsushi Yamaguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 116 days.

(21) Appl. No.: 11/354,156

(22) Filed: Feb. 15, 2006

(65) Prior Publication Data

US 2006/0207874 A1    Sep. 21, 2006

(30) Foreign Application Priority Data

Mar. 18, 2005    (JP) .............................. 2005-080261

(51) Int. Cl.
    *C25D 21/00*    (2006.01)
(52) U.S. Cl. ............ 204/228.8; 204/229.9; 204/196.01; 204/196.11; 204/230.1; 204/230.7
(58) Field of Classification Search ............. 204/229.4, 204/229.9, 228.8, 196.01, 196.11, 230.1, 204/230.7
    See application file for complete search history.

(56) References Cited

U.S. PATENT DOCUMENTS 2,975,111 A * 3/1961 Reimert et al. ............... 205/359

FOREIGN PATENT DOCUMENTS

| JP | 55152200 | * 11/1980 |
| JP | U-58-101882 | 7/1983 |
| JP | U-59-54566 | 4/1984 |
| JP | A 10-092602 | 4/1998 |
| JP | A 2000-054198 | 2/2000 |

OTHER PUBLICATIONS

English abstract of JP 55152200 from East.*

* cited by examiner

*Primary Examiner*—Harry Wilkins
*Assistant Examiner*—Zulmariam Mendez
(74) *Attorney, Agent, or Firm*—Oliff & Berridge, PLC

(57) ABSTRACT

A plating apparatus for plating a substrate comprises a power supply for generating a voltage between a pair of terminals; an anode connected to one terminal of the power supply; a main cathode connected to the other terminal of the power supply while in contact with the substrate; an auxiliary cathode connected to the other terminal of the power supply while out of contact with the substrate; a main resistance R1 connected in series between the other terminal of the power supply and the main cathode; and an auxiliary resistance R2 connected in series between the other terminal of the power supply and the auxiliary cathode.

4 Claims, 7 Drawing Sheets

PLATING APPARATUS

BACKGROUND OF THE INVENTION

1. Field of the Invention

The present invention relates to a plating apparatus.

2. Related Background Art

Plating apparatus have been in use for forming plating films on surfaces of substrates. In the manufacture of microdevices in recent years, it has been important to regulate film thickness distributions finely on the substrate, so as to increase the evenness in plating film thickness.

Known as an example of plating apparatus which can regulate the plating film thickness distributions is a plating apparatus comprising an annular main cathode in contact with the periphery of a substrate, an annular auxiliary cathode laminated on the main cathode by way of an insulator while out of contact with the substrate, and an anode opposing the substrate while being separated therefrom as disclosed in Japanese Patent Application Laid-Open No. 2000-54198. A DC main power supply is connected between the anode and main cathode, whereas a DC auxiliary power supply is connected between the anode and auxiliary cathode.

In the above-mentioned plating apparatus, the DC main power supply and DC auxiliary power supply can feed different currents between the anode and main cathode and between the anode and auxiliary cathode, respectively, whereby radial distributions can favorably be regulated in plating films.

On the other hand, as disclosed in Japanese Patent Application Laid-Open No. H10-92602 and the like, it has been found that plating effected with pulsed currents can further increase the evenness in plating films.

However, the above-mentioned plating apparatus necessitates a plurality of power supplies, thereby raising the cost, which may be problematic. In particular, when each of a plurality of power supplies is a power supply which can supply a pulsed current, the cost further rises. In addition, when plating is effected with pulsed currents, the main and auxiliary power supplies must synchronize their pulses, which further complicates circuit structures, thereby raising the cost.

In order to overcome the problems mentioned above, it is an object of the present invention to provide a plating apparatus which can regulate the plating film thickness while being low in cost.

The present invention provides a plating apparatus for plating a substrate, the apparatus comprising a power supply for generating a voltage between a pair of terminals; an anode connected to one of the terminals of the power supply; a main cathode connected to the other terminal of the power supply while in contact with the substrate; an auxiliary cathode connected to the other terminal of the power supply while out of contact with the substrate; a main resistance connected in series between the other terminal of the power supply and the main cathode; and an auxiliary resistance connected in series between the other terminal of the power supply and the auxiliary cathode.

The present invention supplies respective currents between the main cathode and anode and between the auxiliary cathode and anode from one power supply, and can set the respective current values flowing between the main cathode and anode and between the auxiliary cathode and anode by setting the main and auxiliary resistances to favorable values. As a consequence, one power supply is sufficient, so that a low-cost plating apparatus is realized. Further, when the respective current values flowing between the main cathode and anode and between the auxiliary cathode and anode are adjusted, plating film thickness distributions can be regulated, whereby a higher evenness is achieved in plating film thickness.

Preferably, the above-mentioned power supply feeds a pulsed current between the pair of terminals.

The evenness in a plating film further increases when a pulsed current is employed in plating. Since the present invention necessitates only one power supply capable of generating a pulsed current, which is relatively expensive, its cost is not much higher than that required for modifying a conventional plating apparatus. Though means for synchronizing pulses between power supplies is necessary when modifying the conventional plating apparatus, one power supply capable of generating a pulsed current applies respective pulsed currents between the main cathode and anode and between the auxiliary cathode and anode in the present invention, whereby respective waveforms of pulsed currents flowing between the main cathode and anode and between the auxiliary cathode and anode are inevitably in synchronization with each other. Therefore, a plating apparatus which can further improve the evenness in plating films can be realized at a low cost.

Preferably, at least one of the main and auxiliary resistances is a variable resistance.

This can favorably change the ratio of respective currents flowing between the main cathode and anode and between the auxiliary cathode and anode.

Preferably, the main cathode has an annular form and is in contact with a peripheral part of the substrate, the auxiliary cathode has an annular form and opposes the main cathode, an insulating layer is provided between the main and auxiliary cathodes, and the main and auxiliary cathodes have respective outer diameters different from each other.

This is favorable in that a sufficient distance can be secured between the outer peripheral face of the main cathode and the outer peripheral face of the auxiliary cathode, whereby the main and auxiliary cathodes are restrained from short-circuiting even when the insulating layer is made thinner. From the viewpoint of improving the stirrability of plating liquids in particular, it is desirable that the insulating layer, main cathode, and auxiliary cathode be made thinner.

The present invention provides a plating apparatus which can regulate the plating film thickness while being low in cost.

EXPLANATIONS OF NUMERALS OR LETTERS

5 . . . substrate; 5P . . . peripheral part; 20 . . . anode; 31 . . . main cathode; 32 . . . auxiliary cathode; 40 . . . insulating layer; 70a, 70b . . . terminal; 70 . . . power supply; R1 . . . main variable resistance (main resistance); R2 . . . auxiliary variable resistance (auxiliary resistance); D31 . . . main cathode's outer diameter; D32 . . . auxiliary cathode's outer diameter; 100 . . . plating apparatus.

DESCRIPTION OF THE PREFERRED EMBODIMENTS

Figure 1:
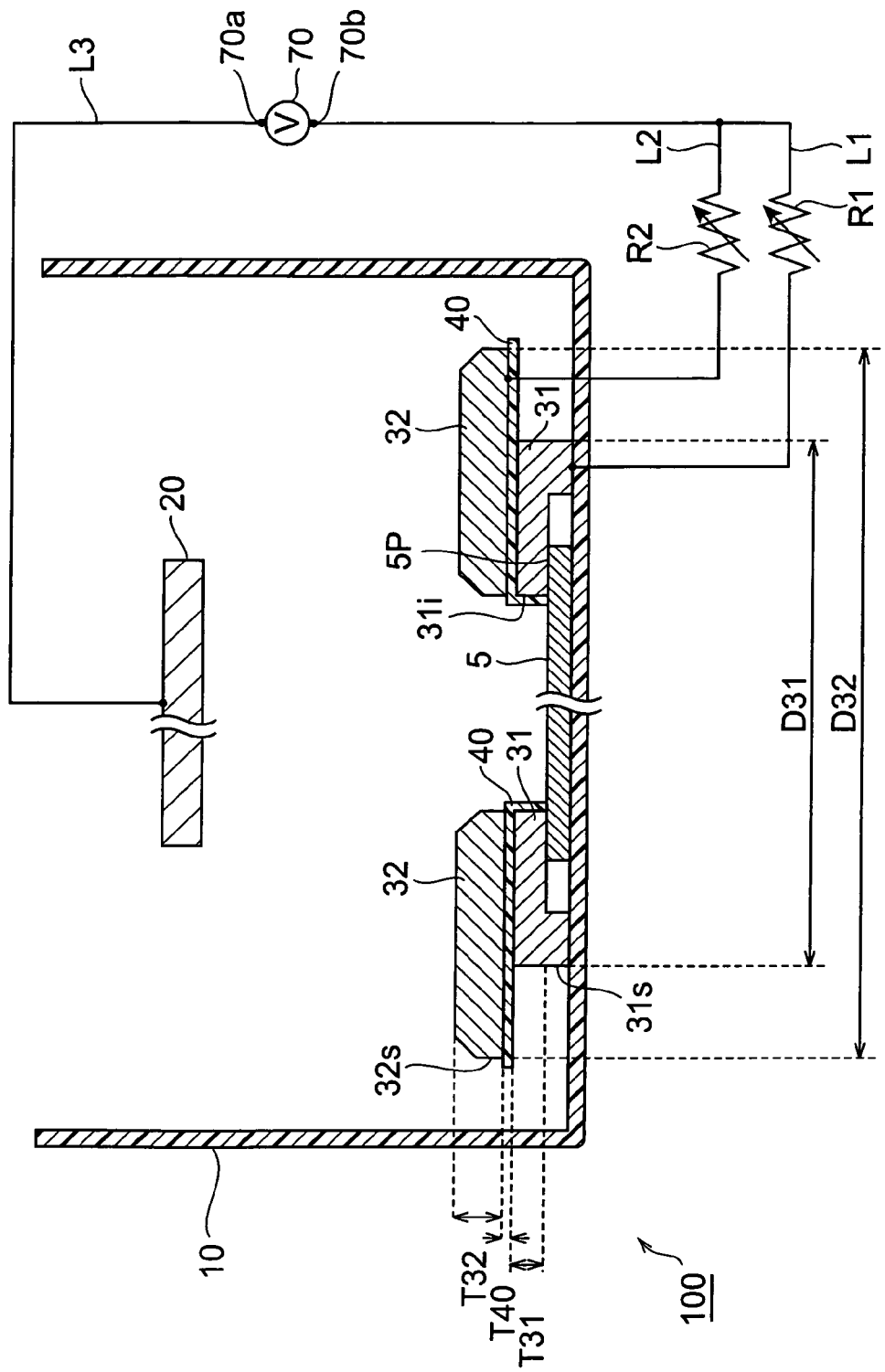
FIG. 1 is a schematic diagram of the plating apparatus in accordance with an embodiment of the present invention.

In the following, a preferred embodiment of the present invention will be explained with reference to the drawings. FIG. 1 is a schematic diagram of the plating apparatus in accordance with this embodiment.

The plating apparatus 100 in accordance with this embodiment, which is an apparatus for forming a plating film on a surface of a substrate 5, mainly comprises a container 10, a main cathode 31, an auxiliary cathode (auxiliary electrode) 32, an anode 20, a power supply 70, a main variable resistance R1, and an auxiliary variable resistance R2.

The container 10, which is made of a resin or the like, secures therewithin the substrate 5 to be plated and stores a plating liquid therewithin. The substrate 5 is a conductive substrate, an example of which is a substrate having a surface formed with a layer made of a metal material such as copper. A resist pattern may be provided on the substrate. Here, a disk-shaped substrate is used. Various kinds of known plating liquids can be utilized without being restricted in particular.

The main cathode 31, which is made of a conductive material while having an annular form, comes into contact with the substrate 5 from thereabove so as to cover a peripheral part 5P of the upper face of the substrate 5, thereby securing the substrate 5. As a consequence, the center part of the substrate 5 excluding the peripheral part 5P is exposed to the outside.

The auxiliary cathode 32, which is made of a conductive material and has an annular form substantially corresponding to the main cathode 31, is concentrically overlaid on the main cathode 31 by way of an insulating layer 40. The outer diameter D32 of the auxiliary cathode 32 is greater than the outer diameter D31 of the main cathode 31, whereby the outer peripheral face 31S of the main cathode 31 and the outer peripheral face 32S of the auxiliary cathode 32 are separated from each other along the radial direction of the ring of the main cathode 31.

The insulating layer 40 having an annular form is interposed between the main cathode 13 and auxiliary cathode 32, such that its radially inner end part covers the inner peripheral face 31i of the main cathode 31 and comes into contact with the substrate 5, whereas its radially outer end part projects out of the outer peripheral face 32S of the auxiliary cathode 32.

Preferably, the thickness T31 of the part of main cathode 31 above the substrate 5 is 0.1 to 1.0 mm, for example, whereas the thickness T40 of the insulating layer 40 is 0.05 to 0.5 mm, for example.

The anode 20 is provided in the upper part within the container 10 and opposes the substrate 5.

Examples of materials for the main cathode 31, auxiliary cathode 32, and anode 20 include metal materials such as Pt and Ni, whereas examples of materials for the insulating layer 40 include insulating materials such as rubbers and resins.

The power supply 70 is provided on the outside of the container 10. The power supply 70 can output pulsed waves (e.g., rectangular waves) having a desirable time width and a desirable voltage value between terminals 70a, 70b a plurality of times. Therefore, the power supply 70 can feed a pulsed current between the terminals 70a, 70b.

The terminal 70b is connected to the main cathode 31 through a lead L1. The terminal 70b is also connected to the auxiliary cathode 32 through a lead L2. On the other hand, the terminal 70a is connected to the anode 20 through a lead L3.

Further, the main variable resistance R1 is connected to the lead L1, whereas the auxiliary variable resistance R2 is connected to the lead L2. Namely, the main variable resistance R1 is connected in series between the main cathode 31 and terminal 70b, whereas the auxiliary variable resistance R2 is connected in series between the auxiliary cathode 32 and terminal 70b.

Respective resistance values of the main variable resistance R1 and auxiliary variable resistance R2 can be set to given favorable values depending on plating conditions and the like. Typically, R1>0, R2>0, and R1≠R2. Preferably, the insulating layer 40 functions as an insulator whose resistance exceeds 100 MΩ between the main cathode 31 and auxiliary cathode 32.

A method of using such a plating apparatus 100 will now be explained. A plating liquid is fed into the container 10, and then the power supply 70 generates a pulsed current a plurality of times at predetermined intervals. As a consequence, respective pulsed currents I1, I2 flow between the substrate 5 in contact with the main cathode 31 and the anode 20 and between the auxiliary cathode 32 and the anode 20. Accordingly, ions in the plating liquid are deposited on the surface of the substrate 5, thereby generating a plating film on the substrate 5.

Here, one power supply 70 supplies respective pulsed currents between the main cathode 31 and anode 20 and between the auxiliary cathode 32 and anode 20. When the main variable resistance R1 and auxiliary variable resistance R2 are set to their respective favorable values, the current I1 flowing between the main cathode 31 and anode 20 and the current I2 flowing between the auxiliary cathode 32 and anode 20 can be set to desirable values.

As a consequence, one power supply 70 is sufficient, which cuts the cost down, whereas a plating film exhibiting a high evenness in film thickness can be formed depending on plating liquid conditions, substrate conditions, and the like when the current values I1, I2 are adjusted.

Since the power supply 70 feeds a pulsed current between the terminals 70a, 70b, the evenness in plating films is better than that of a fixed current system without pulses. In particular, this embodiment necessitates only one power supply 70 capable of generating a pulsed current, which is relatively expensive, and thus can lower the cost as compared with an apparatus in which two power supplies of a conventional plating apparatus are turned into those capable of generating a pulsed current.

In particular, since there is only one power supply 70, the respective pulses of current values I1 and I2 are inevitably in synchronization with each other in this embodiment. This makes it unnecessary to provide synchronizing means such as regulator for synchronizing pulses between two power supplies. As a consequence, a plating film having a high evenness can be realized with a very low cost.

Since both of the main variable resistance R1 and auxiliary variable resistance R2 are variable resistances, the ratio of currents I1 and I2 can be changed favorably.

Since the outer diameter D31 of the main cathode 31 and the outer diameter D32 of the auxiliary cathode 32 differ from each other, a sufficient distance can be secured between the outer peripheral face 31S of the main cathode 31 and the outer peripheral face 32S of the auxiliary cathode 32, which is favorable in that the main cathode 31 and auxiliary cathode 32 are restrained from short-circuiting even when the insulating layer 40 is made thinner. While the main cathode 31, auxiliary cathode 32, and insulating layer 40 are required to be made thinner from the viewpoint of improving the stirrability of plating liquids in particular, this embodiment is effective in this regard.

Without being restricted to the above-mentioned embodiment, the present invention can be modified in various manners.

For example, though the above-mentioned embodiment employs a power supply capable of supplying a pulsed current as the power supply 70, the present invention can be realized with a power supply which feeds a fixed DC current.

Though the above-mentioned embodiment is equipped with only one set of the main cathode 31, auxiliary cathode 32, main variable resistance R1, and auxiliary variable resistance R2, it may comprise a plurality of such sets which are connected to one power supply 70. In this case, the individual main cathodes 31 are in contact with respective parts of the substrate 5 different from each other. This yields a multichannel plating apparatus which can apply different voltages to respective places of one substrate 5, thereby greatly contributing to the evenness in thickness of plating films in particular when the substrate is large and so forth.

Though both of the main variable resistance R1 and auxiliary resistance R2 are variable resistances in the above-mentioned embodiment, the present invention can also be realized either when only one of them is a variable resistance while the other is a fixed resistance or when both of them are fixed resistances.

Though the outer diameter D31 of the main cathode 31 is smaller than the outer diameter D32 of the auxiliary cathode 32 in the above-mentioned embodiment, the former may be greater than the latter. The present invention can also be realized when D31=D32.

The above-mentioned embodiment can further favorably adjust the current values I1 and I2 by changing the form or position of at least one of the main cathode 31, auxiliary cathode 32, and insulating layer 40.

Though the plating apparatus comprises R1 and R2 in the above-mentioned embodiment, a plating apparatus free of R1 and R2 can adjust the current values I1 and I2 by changing the form or position of at least one of the main cathode 31, auxiliary cathode 32, and insulating layer 40.

EXAMPLE 1

Using the above-mentioned plating apparatus shown in FIG. 1, plating was effected. A substrate to be plated was a ceramic substrate with a diameter of 6 inches having a surface formed with an NiFe film. The plating liquid was an FeCo plating liquid (sulfuric acid bath). The main variable resistance R1=1 $\Omega$, whereas the auxiliary variable resistance R2=1.2 $\Omega$. The pulse fed from the power supply 70 was a rectangular wave with a pulse peak current of 10 A, a pulse bottom current of 0 A, a pulse width of 1 s, and a duty cycle of 0.5. The main cathode thickness T31=0.3 mm. The insulating film thickness T40=0.1 mm. The auxiliary cathode thickness T32=2 mm.

Figure 2:
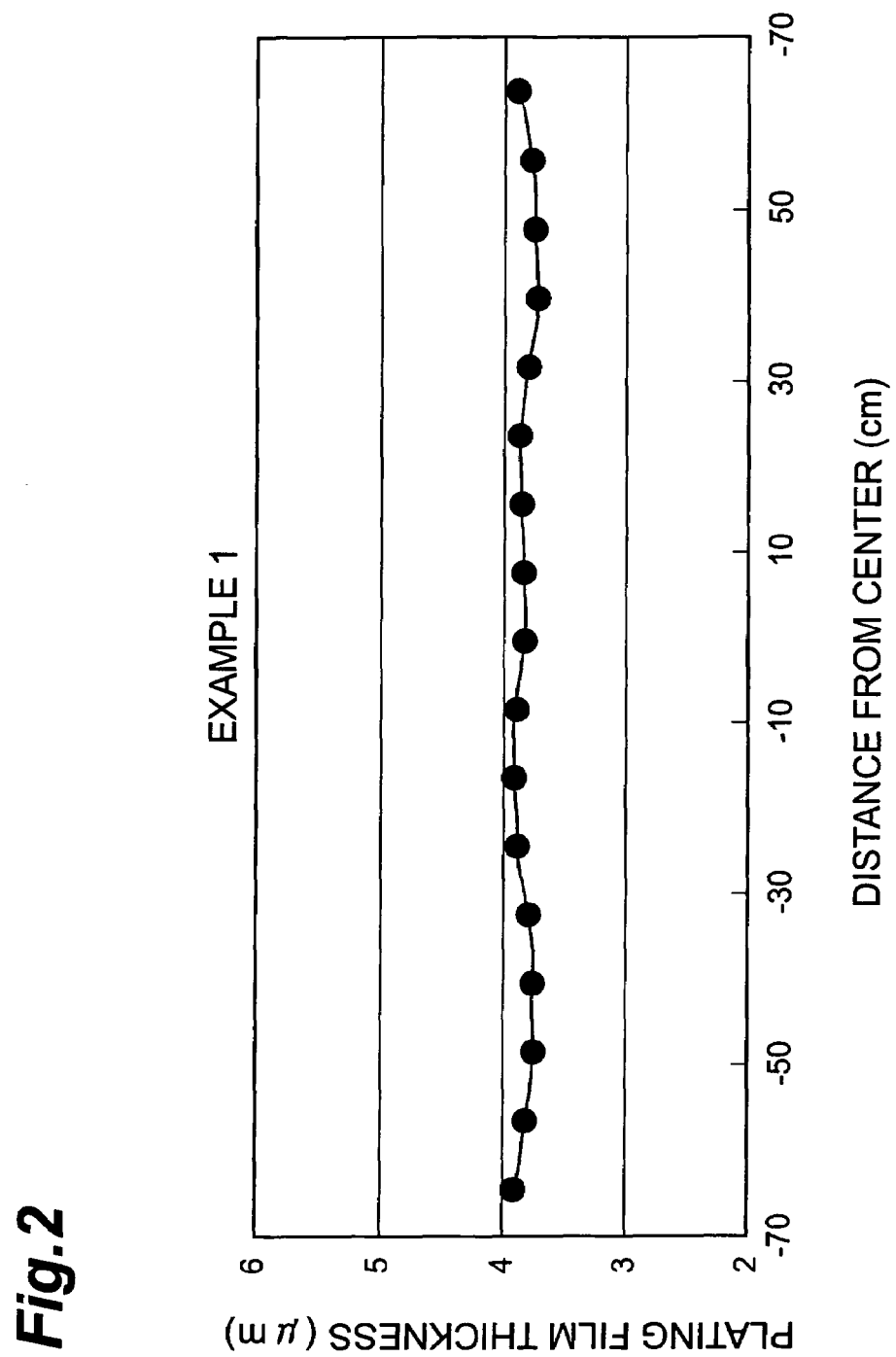
FIG. 2 is a graph of the film thickness distribution of a plating film formed by the plating apparatus of Example 1.
Figure 3:
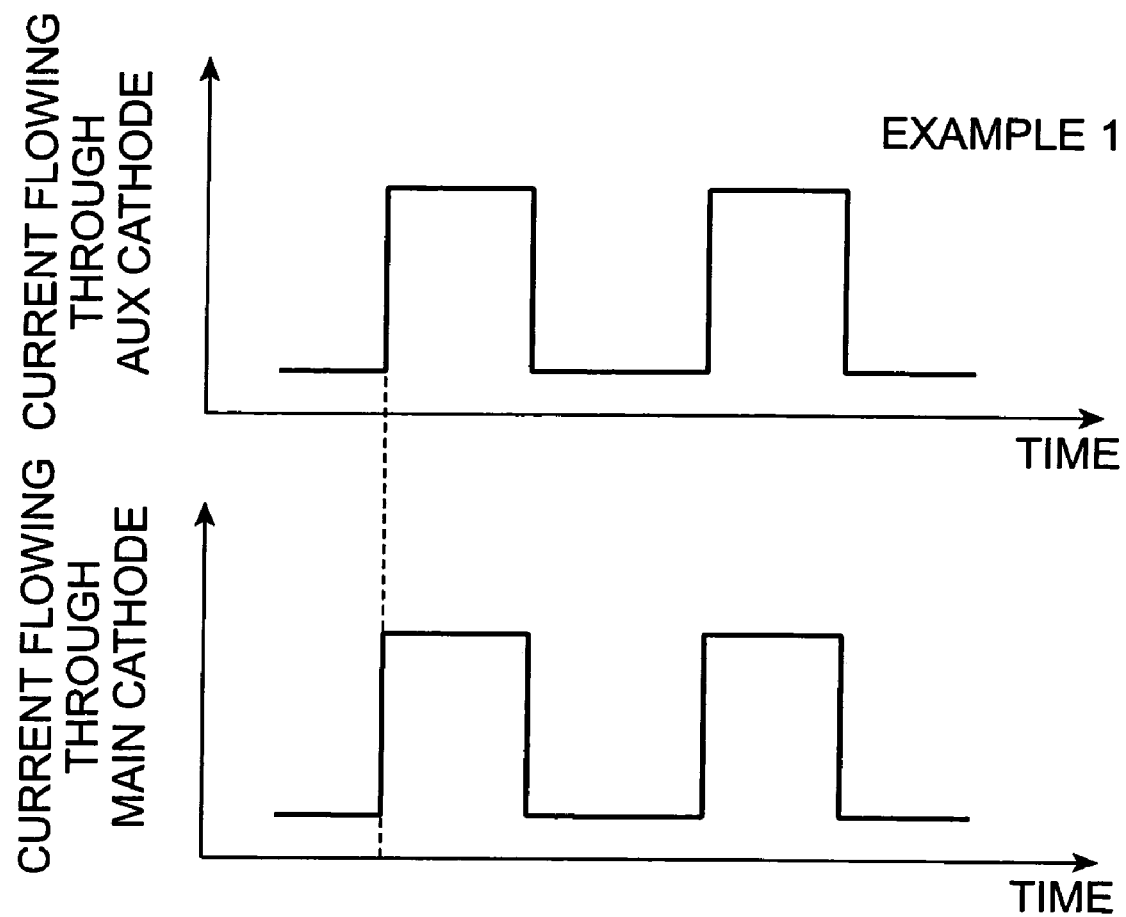
FIG. 3 is a graph showing the change in a current flowing through a main cathode with time and the change in a current flowing through an auxiliary cathode with time during plating by the plating apparatus of Example 1.

FIG. 2 shows the film thickness distribution of the plating film at this time. The plating film was obtained with a very high evenness. FIG. 3 shows the change in the current flowing through the main cathode with time and the change in the current flowing through the auxiliary cathode with time at this time. The pulse flowing through the main cathode and the pulse flowing through the auxiliary cathode were in synchronization with each other. The composition distribution in the plating film exhibited a favorable evenness.

COMPARATIVE EXAMPLE 1

A plating film was made twice as in Example 1 except that two power supplies each used in Example 1 were prepared, one power supply was connected between the anode and main cathode, the other power supply was connected between the anode and auxiliary cathode, and the power supplies fed pulsed currents to the main cathode and auxiliary cathode, respectively. The initially formed plating film is referred to as Comparative Example 1A, whereas the secondly obtained plating film is referred to as Comparative Example 1B. Pulses were not synchronized between the main and auxiliary cathodes in particular.

Figure 4:
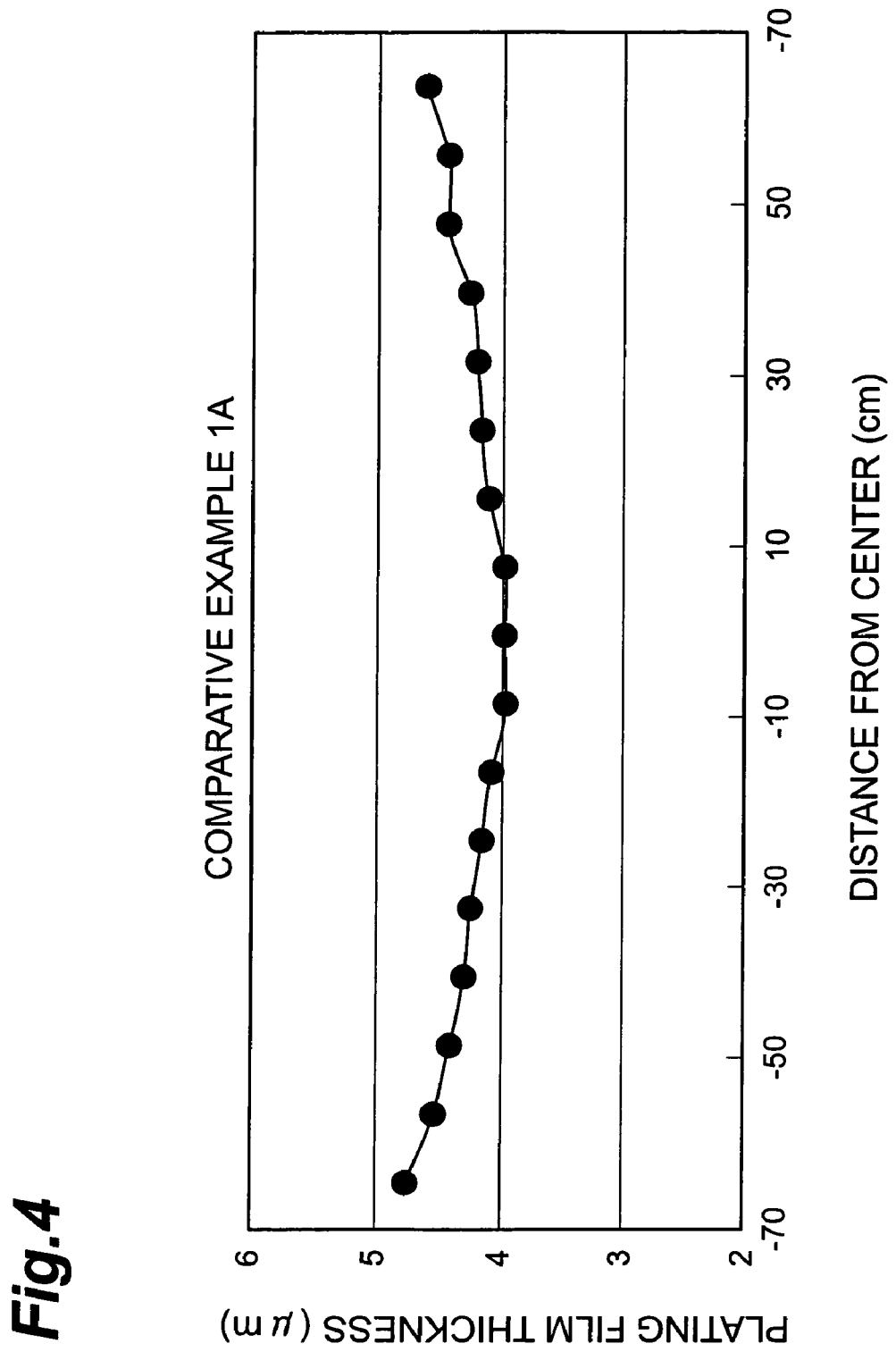
FIG. 4 is a graph of the film thickness distribution of the plating film of Comparative Example 1A formed by the plating apparatus of Comparative Example 1.
Figure 5:
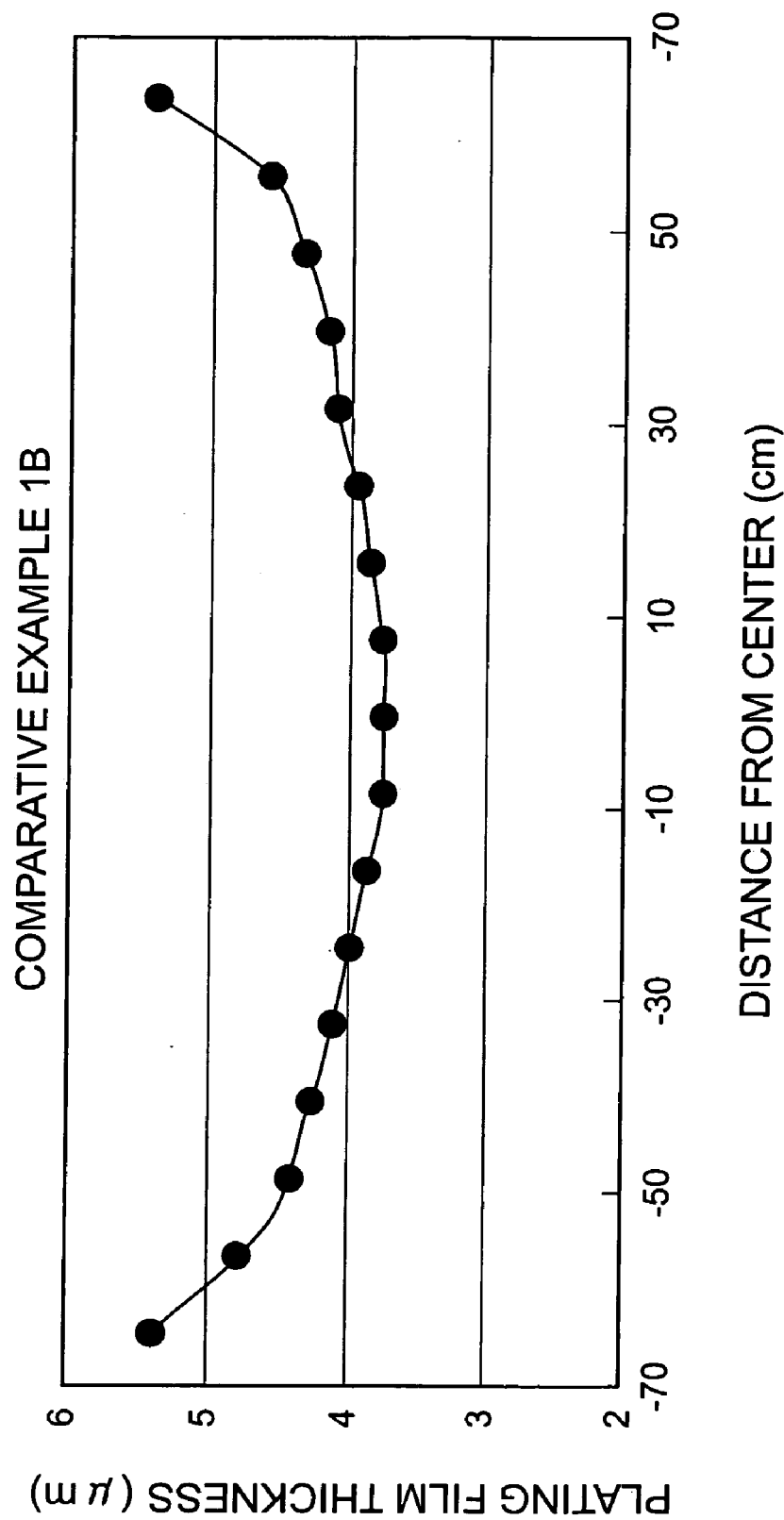
FIG. 5 is a graph of the film thickness distribution of the plating film of Comparative Example 1B formed by the plating apparatus of Comparative Example 1.
Figure 6:
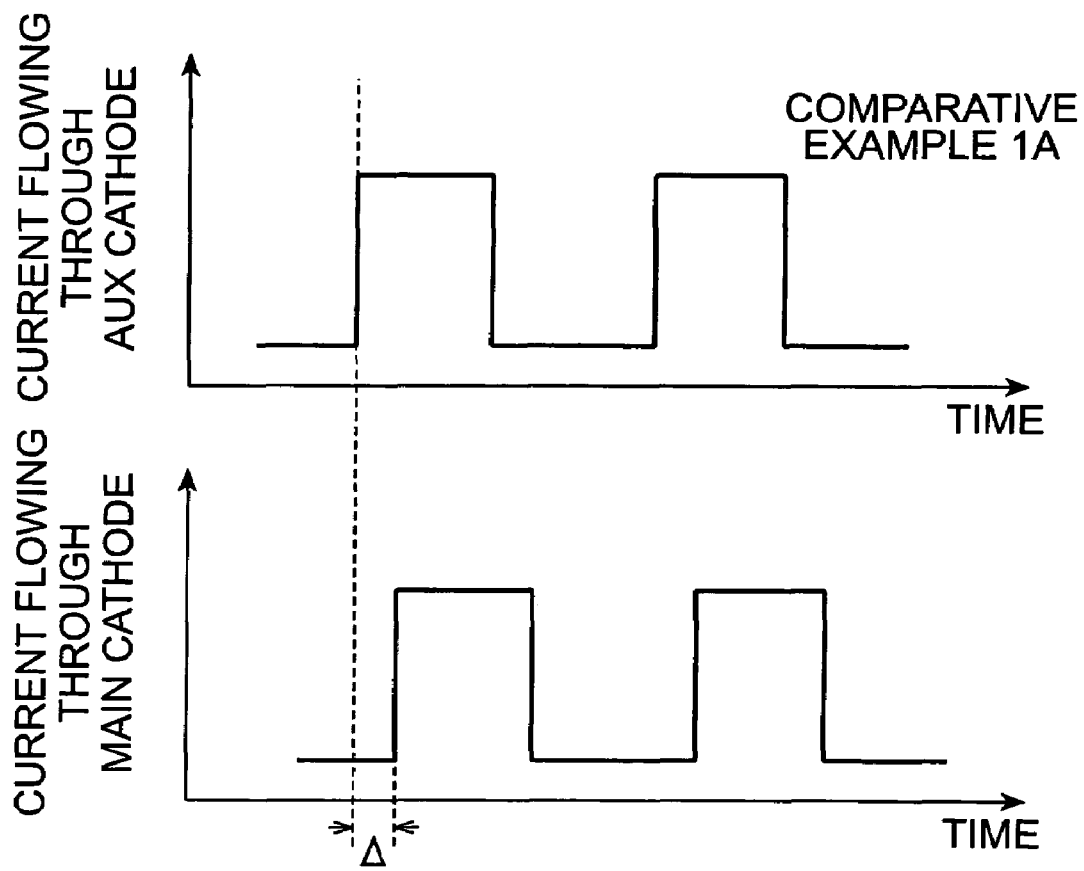
FIG. 6 is a graph showing the change in a current flowing through the main cathode with time and the change in a current flowing through the auxiliary cathode with time when forming the plating film of Comparative Example 1A.
Figure 7:
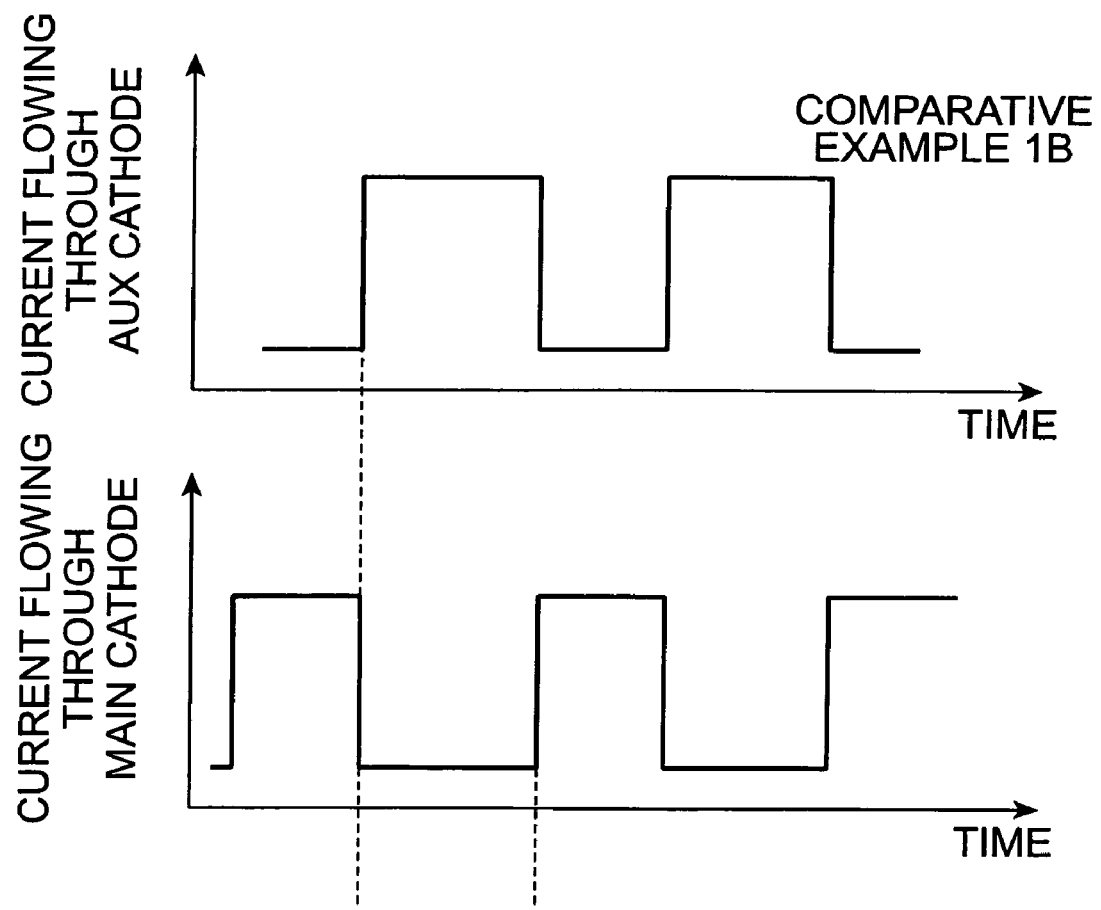
FIG. 7 is a graph showing the change in a current flowing through the main cathode with time and the change in a current flowing through the auxiliary cathode with time when forming the plating film of Comparative Example 1B.

FIGS. 4 and 5 show respective film thickness distributions of Comparative Examples 1A and 1B. Both Comparative Examples 1 and 2 were inferior in terms of evenness in the film thickness distribution and plating film composition distribution, and exhibited surface burning. FIGS. 6 and 7 show respective changes in the current flowing through the main cathode with time and respective changes in the current flowing through the auxiliary cathode with time at this time in Comparative Examples 1A and 1B. A phase shift of time Δ and a phase inversion occurred in the respective pulsed currents generated from the power supplies.

What is claimed is:

1. A plating apparatus comprising:
    a power supply for generating a voltage between a pair of terminals;
    an anode connected to one of the terminals of the power supply;
    a main cathode connected to the other terminal of the power supply while in contact with a substrate;
    an auxiliary cathode connected to the other terminal of the power supply while out of contact with the substrate;
    a main resistance connected in series between the other terminal of the power supply and the main cathode; and
    an auxiliary resistance connected in series between the other terminal of the power supply and the auxiliary cathode;
    wherein the main cathode has an annular form and is in contact with a peripheral part of the substrate;
    wherein the auxiliary cathode has an annular form and opposes the main cathode;
    wherein an insulating layer is provided between the main and auxiliary cathodes;
    wherein an outer diameter of the auxiliary cathode is larger than an outer diameter of the main cathode;
    wherein the auxiliary cathode includes a protruding part projecting in a radial direction beyond an outer face of the main cathode, the insulating layer covering a portion of a surface of the protruding part, the insulating layer projecting from the auxiliary cathode in the radial direction beyond an outer face of the auxiliary cathode.

2. The plating apparatus according to claim 1, wherein the power supply feeds a pulsed current between the pair of terminals.

3. The plating apparatus according to claim 1, wherein at least one of the main and auxiliary resistances is a variable resistance.

4. The plating apparatus according to claim 1,
    wherein the protruding part is connected to the auxiliary resistance through a lead, the lead penetrating through the insulating layer.

* * * * *